United States Patent
Shirakawa (10) Patent No.: US 11,342,303 B2
(45) Date of Patent: May 24, 2022

(54) MEMBER CONNECTION METHOD AND ADHESIVE TAPE

(71) Applicant: HITACHI CHEMICAL COMPANY, LTD., Tokyo (JP)

(72) Inventor: Tetsuyuki Shirakawa, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 0 days.

(21) Appl. No.: 16/965,774

(22) PCT Filed: Jan. 31, 2019

(86) PCT No.: PCT/JP2019/003475
§ 371 (c)(1),
(2) Date: Jul. 29, 2020

(87) PCT Pub. No.: WO2019/151434
PCT Pub. Date: Aug. 8, 2019

(65) Prior Publication Data
US 2021/0074674 A1    Mar. 11, 2021

(30) Foreign Application Priority Data
Feb. 1, 2018 (JP) .............................. JP2018-016341

(51) Int. Cl.
*H01L 23/00* (2006.01)
*C09J 7/38* (2018.01)

(52) U.S. Cl.
CPC ............... *H01L 24/83* (2013.01); *C09J 7/38* (2018.01); *H01L 24/29* (2013.01);
(Continued)

(58) Field of Classification Search
CPC .................................................. C09J 2203/326
See application file for complete search history.

(56) References Cited

U.S. PATENT DOCUMENTS

| | | | | |
|---|---|---|---|---|
| 2010/0080989 A1* | 4/2010 | Asai | ........................ | C09J 7/385 428/345 |
| 2010/0129986 A1* | 5/2010 | Kamiya | .................. | B32B 27/36 438/464 |

(Continued)

FOREIGN PATENT DOCUMENTS

| | | |
|---|---|---|
| JP | S56-065948 U | 6/1981 |
| JP | H9-111196 A | 4/1997 |

(Continued)

*Primary Examiner* — Dale E Page
*Assistant Examiner* — Wilner Jean Baptiste
(74) *Attorney, Agent, or Firm* — Fitch, Even, Tabin & Flannery LLP (57) ABSTRACT

This member connection method includes: a cutting step of forming cutting lines C in an adhesive layer at predetermined intervals at least in a width direction of an adhesive tape and making segments of the adhesive layer divided by the cutting lines C continuous at least in a lengthwise direction of the adhesive tape; a transfer step of disposing the segments to face a connection surface of one member to be connected, pressing a heating and pressing tool having an arbitrary pattern shape against the adhesive tape from a separator side and selectively transferring the segments to the one member to be connected; and a connection step for connecting another member to be connected to the one member to be connected via the segments transferred to the one member to be connected.

7 Claims, 7 Drawing Sheets

(52) U.S. Cl.
CPC . *C09J 2203/326* (2013.01); *H01L 2224/2932* (2013.01); *H01L 2224/29311* (2013.01); *H01L 2224/29339* (2013.01); *H01L 2224/29344* (2013.01); *H01L 2224/29347* (2013.01); *H01L 2224/29355* (2013.01); *H01L 2224/29369* (2013.01); *H01L 2224/29384* (2013.01); *H01L 2224/29393* (2013.01); *H01L 2224/83851* (2013.01)

(56) References Cited

U.S. PATENT DOCUMENTS

2015/0107764 A1\* 4/2015 Katayama ............... H01L 24/27
156/248
2018/0015757 A1\* 1/2018 Nakai .................... B41J 15/044

FOREIGN PATENT DOCUMENTS

| | | |
|---|---|---|
| JP | H9-137136 A | 5/1997 |
| JP | H10-140096 A | 5/1998 |
| JP | 2001-284005 A | 10/2001 |

\* cited by examiner

MEMBER CONNECTION METHOD AND ADHESIVE TAPE

CROSS-REFERENCE TO RELATED APPLICATIONS

This application is a U.S. national phase application filed under 35 U.S.C. § 371 of International Application No. PCT/JP2019/003475, filed Jan. 31, 2019, designating the United States, which claims priority from Japanese Patent Application 2018-016341, filed Feb. 1, 2018, which are hereby incorporated herein by reference in their entirety.

TECHNICAL FIELD

The present disclosure relates to a member connection method and an adhesive tape.

BACKGROUND ART

Conventionally, an adhesive tape which has applications such as connecting members to be connected having a large number of electrodes and fixing a lead frame is known. An example of such an adhesive tape is an anisotropic conductive tape (ACF) (refer to Patent Document 1, for example). The anisotropic conductive tape is a connection material in which, for example, when a member such as a semiconductor element like as an IC and an LSI, or a package is connected to a substrate such as a printed wiring board, a glass substrate for LCD, and a flexible printed board, both electrical connection and mechanical fixation are achieved to maintain a conductive state between opposing electrodes while maintaining an insulating state between adjacent electrodes. Such an adhesive tape is also used for bonding electronic components such as a liquid crystal panel, a plasma display panel (PDP), an electroluminescence (EL) panel, and a bare chip mounting to a circuit board, bonding circuit boards to each other, and the like.

Figure 6:
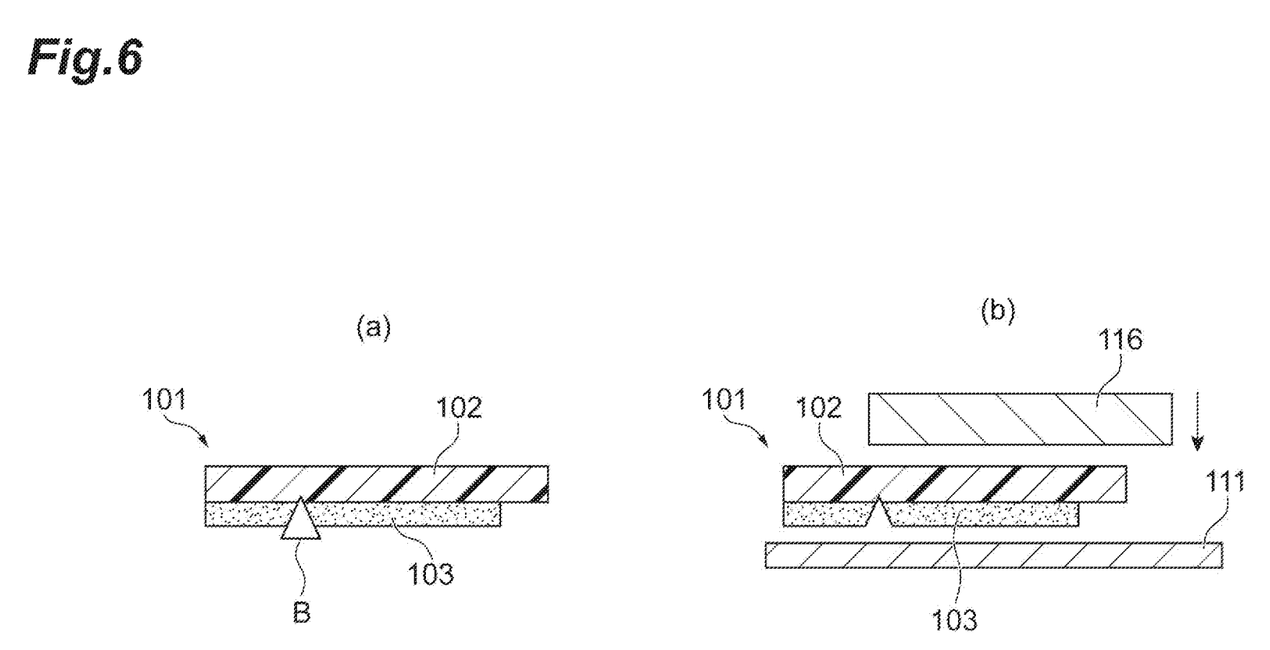
FIG. 6 is a schematic cross-sectional view showing a general member connection method using an adhesive tape.
Figure 7:
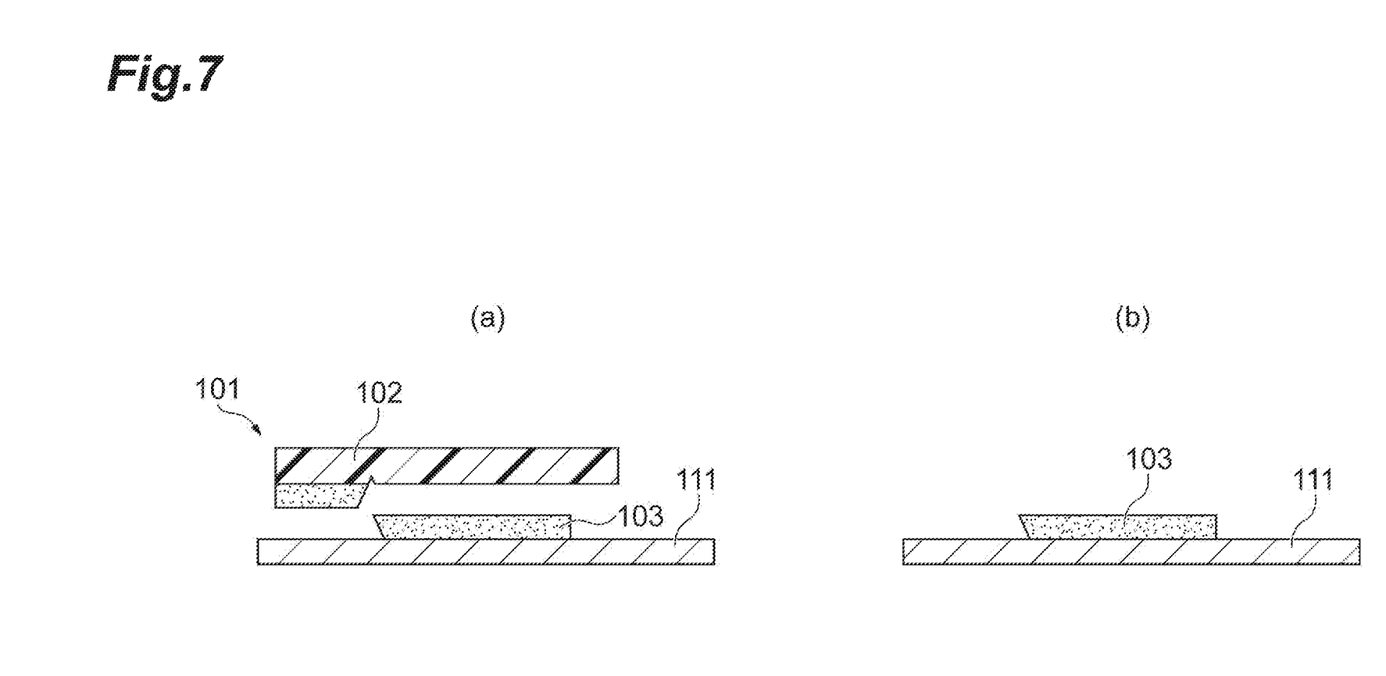
FIG. 7 is a schematic cross-sectional view showing a step subsequent to that of FIG. 6.

In a general member connection method using the adhesive tape, in an attaching step of attaching an adhesive layer 103 to a member 111 to be connected, first, as shown in FIG. 6(a), the adhesive layer 103 on the tip end side of an adhesive tape 101 is half-cut. Here, a blade B is put in the adhesive layer 103 to an extent that a blade mark is left on a separator 102 of the adhesive tape 101. Next, as shown in FIG. 6(b), a heat tool 116 is pressed from the separator 102 side to the adhesive layer 103 on the tip end side further than a half-cut position. Thus, as shown in FIG. 7(a), the adhesive layer 103 on the tip end side further than the half-cut position is released from the separator 102, and the adhesive layer 103 is attached to the member 111 to be connected as shown in FIG. 7(b).

CITATION LIST

Patent Literature

[Patent Literature 1] Japanese Unexamined Patent Publication No. 2001-284005

SUMMARY OF INVENTION

Technical Problem

In the above-described conventional method, since the adhesive tape is half-cut in the attaching step, there is a problem that a degree of freedom in a shape of the adhesive layer disposed on the member to be connected is poor. In addition, there is a problem that accuracy of alignment of the adhesive layer with respect to the member to be connected is required at the time of attachment.

The present disclosure has been made to solve the above problems, and an object thereof is to provide a member connection method in which requirement for accuracy of alignment of an adhesive layer with respect to a member to be connected can be relaxed, and the adhesive layer can be disposed in an arbitrary shape on the member to be connected, and an adhesive tape applied to such a method.

Solution to Problem

A member connection method according to an aspect of the present disclosure is a member connection method for connecting members to be connected using an adhesive tape having an adhesive layer provided on one surface side of a separator, including a cutting step of forming cutting lines in the adhesive layer at a predetermined interval at least in a width direction of the adhesive tape and making segments of the adhesive layer divided by the cutting lines continuous at least in a lengthwise direction of the adhesive tape, a transfer step of disposing the segments of the adhesive layer to face a connection surface of one member to be connected, pressing a heating and pressing tool having an arbitrary pattern shape against the adhesive tape from a separator side and selectively transferring the segments of the adhesive layer corresponding to a pressing portion of the heating and pressing tool to the one member to be connected, and a connection step of connecting another member to be connected to the one member to be connected via the segments of the adhesive layer transferred to the one member to be connected.

In the member connection method, the segments of the adhesive layer are made continuous in advance in the lengthwise direction of the adhesive tape by the cutting lines formed in the adhesive layer in the cutting step. Then, in the transfer step, the segments of the adhesive layer are selectively transferred to the one member to be connected using the heating and pressing tool. A pattern shape of the segments of the adhesive layer transferred in the transfer step can be arbitrarily adjusted by a pattern shape of the heating and pressing tool. Therefore, the adhesive layer can be disposed in an arbitrary shape with respect to the member to be connected. Further, in the member connection method, since the segments of the adhesive layer are made continuous in advance in the lengthwise direction of the adhesive tape, strict alignment between the one member to be connected and the adhesive layer is not required in the transfer step.

Further, in the cutting step, the cutting lines may be formed in the adhesive layer at predetermined intervals in the width direction and the lengthwise direction of the adhesive tape, and the segments of the adhesive layer divided by the cutting lines may be continuous in the width direction and the lengthwise direction of the adhesive tape. In this case, since the segments of the adhesive layer are two-dimensionally formed, a degree of freedom in arrangement of the adhesive layer with respect to the member to be connected can be improved.

Further, in the cutting step, after the adhesive tape is delivered from a tape roll and the cutting lines are formed in the adhesive layer, the adhesive tape may be wound to form a wound body. In this case, since the cutting step and the transfer step are separated from each other, it is possible to avoid an increase in size and complexity of a device on a site in which the transfer step is performed.

Further, the adhesive layer may be provided on an entire surface of the separator on one surface side. In this case, it is possible to further reduce a requirement for alignment accuracy between the one member to be connected and the adhesive layer in the transfer step.

Also, an adhesive tape according an aspect of the present invention is an adhesive tape having an adhesive layer provided on one surface side of a separator, wherein cutting lines are formed in the adhesive layer at least at a predetermined interval in a width direction of the adhesive tape, and segments of the adhesive layer divided by the cutting lines are continuous at least in a lengthwise direction of the adhesive tape.

In the adhesive tape, the segments of the adhesive layer are continuous in the lengthwise direction of the adhesive tape via the cutting lines formed in the adhesive layer. In the adhesive tape, the segments of the adhesive layer can be selectively transferred to the one member to be connected using the heating and pressing tool. A pattern shape of the segments of the adhesive layer transferred to the one member to be connected can be arbitrarily adjusted by a pattern shape of the heating and pressing tool. Therefore, the adhesive layer can be disposed in an arbitrary shape with respect to the one member to be connected. Further, in the adhesive tape, since the segments of the adhesive layer are made continuous in advance in the lengthwise direction of the adhesive tape, strict alignment between the one member to be connected and the adhesive layer is not required at the time of transferring.

Advantageous Effects of Invention

According to the present disclosure, it is possible to relax the requirements for accuracy of alignment of the adhesive layer with respect to the member to be connected, and to dispose the adhesive layer in an arbitrary shape on the member to be connected.

DESCRIPTION OF EMBODIMENTS

Hereinafter, a preferred embodiment of a member connection method and an adhesive tape according to one aspect of the present disclosure will be described in detail with reference to the drawings.

[Configuration of Adhesive Tape]

Figure 1:
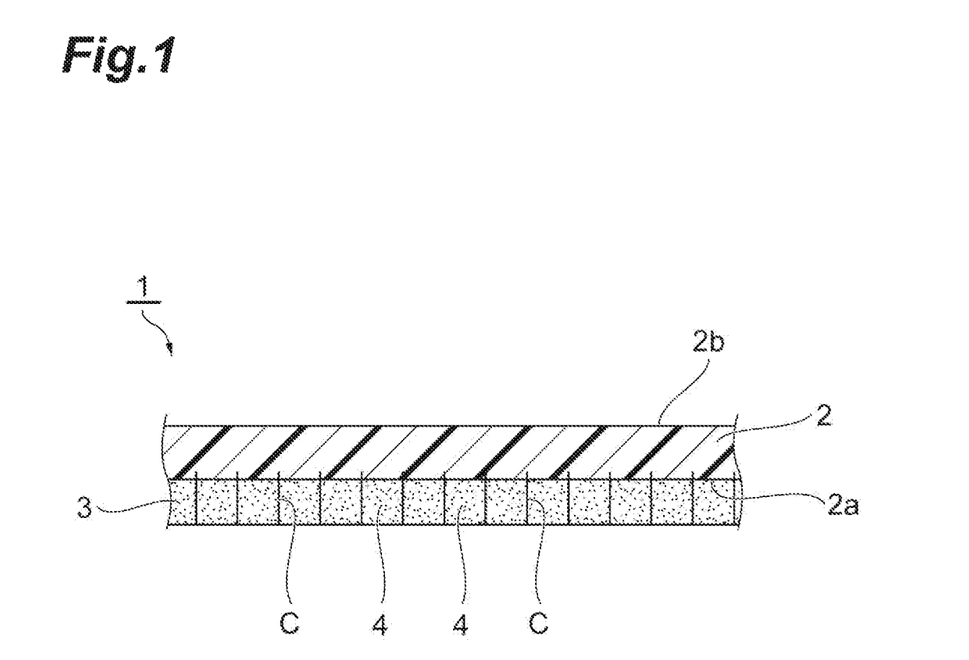
FIG. 1 is a schematic cross-sectional view showing an embodiment of an adhesive tape.
Figure 2:
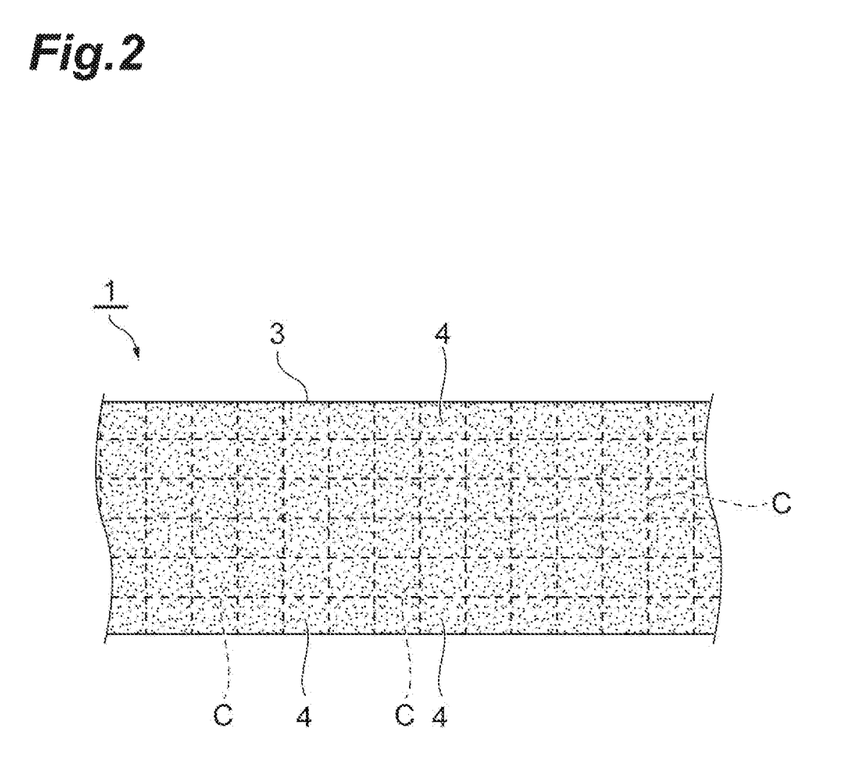
FIG. 2 is a schematic plan view showing an adhesive layer of the adhesive tape shown in FIG. 1.

FIG. 1 is a schematic cross-sectional view showing an embodiment of an adhesive tape. Also, FIG. 2 is a schematic plan view showing an adhesive layer of the adhesive tape shown in FIG. 1. As shown in the drawings, the adhesive tape 1 has a two-layer structure including a separator 2 and an adhesive layer 3 formed on entire surface of the separator 2 on the one surface 2a side. The adhesive tape 1 is, for example, an anisotropic conductive tape used for connecting members 11A and 11B to be connected (refer to FIG. 5) having a large number of electrodes.

A length of the adhesive tape 1 is, for example, 10 m or more and 1000 m or less. In the embodiment, the length is, for example, 300 m, and the adhesive tape 1 is stored and transported in a wound body. A width of the adhesive tape 1 is, for example, 0.5 mm or more and 25.0 mm or less, preferably 0.5 mm or more and 3.0 mm or less, and more preferably 0.5 mm or more and 2.0 mm or less. A thickness of the adhesive tape 1 is, for example, 5 μm or more and 250 μm or less, preferably 10 μm or more and 40 μm or less, and more preferably 10 μm or more and 20 μm or less.

From the viewpoint of a strength of the adhesive tape 1 and releasability of the adhesive layer 3, for example, oriented polypropylene (OPP), polyethylene terephthalate (PET), polyethylene naphthalate, polyethylene isophthalate, polybutylene terephthalate, polyolefins, polyacetate, polycarbonate, polyphenylene sulfide, polyamide, ethylene/vinyl acetate copolymer, polyvinyl chloride, polyvinylidene chloride, synthetic rubber, liquid crystal polymer, or the like can be used as a material of the separator 2.

A mold release treatment may be performed on the other surface 2b side of the separator 2. For example, an olefin release agent, ethylene glycol montanic acid ester, a carnauba wax, a low melting wax such as petroleum wax, a low molecular weight fluororesin, a silicone-based or fluorine-based surfactant, oil, a wax, a resin, or a silicone resin such as a polyester-modified silicone resin is used as a release agent for performing a mold release treatment. A silicone resin is generally used as the release agent.

For example, an adhesive containing a resin such as a thermoplastic resin, a thermosetting resin, or a mixed type (a mixed resin) of the thermoplastic resin and the thermosetting resin can be used as a material of the adhesive layer 3. A representative thermoplastic resin includes, for example, a styrene resin type and a polyester resin type. A representative thermosetting resin includes, for example, an epoxy resin type, an acrylic resin type, and a silicone resin type.

When the adhesive tape 1 is an anisotropic conductive tape, the adhesive layer 3 may be configured to include an adhesive component and conductive particles optionally contained as necessary. As the adhesive component, for example, a material curable by heat or light can be widely applied, and a crosslinkable material is preferably used because it has excellent heat resistance and moisture resistance after connection. An epoxy-based adhesive in which an epoxy resin which is a thermosetting resin is contained as a main component can be cured for a short time, has good workability in connection and has excellent adhesiveness in molecular structure. For example, a material of which a main component is a high molecular weight epoxy, a solid epoxy or liquid epoxy, or an epoxy obtained by modifying any of these epoxies with urethane, polyester, acrylic rubber, nitrile rubber (NBR), synthetic linear polyamide or the like can be used as the epoxy-based adhesive. The epoxy-based adhesive is generally obtained by adding a curing agent, a catalyst, a coupling agent, a filler, and the like to each of the above-described epoxies which is a main component.

Examples of the conductive particles include particles of a metal such as Au, Ag, Pt, Ni, Cu, W, Sb, Sn, and solder, or carbon. Further, coated particles in which non-conductive glass, ceramic, plastic or the like is used as a core and the core is coated with the above-described metal or carbon may be used. From the viewpoint of dispersibility and conductivity, an average particle diameter of the conductive particles is preferably 1 µm or more and 18 µm or less. Insulating coated particles obtained by coating the conductive particles with an insulating layer may be used, or conductive particles and insulating particles may be used in combination from the viewpoint of improving an insulating property between adjacent electrodes.

As shown in FIG. 2, in the adhesive layer 3, cutting lines C are formed at predetermined intervals in a width direction and a lengthwise direction of the adhesive tape 1. The cutting lines C are formed to reach the one surface 2a of the separator 2 from the adhesive layer 3 side (refer to FIG. 1). In the adhesive layer 3, segments 4 divided by the cutting lines C are in a continuous state in the width direction and the lengthwise direction of the adhesive tape 1. In the embodiment, the linear cutting lines C are respectively formed at intervals of 0.5 mm in the width direction and the lengthwise direction of the adhesive tape 1. Thus, in the adhesive layer 3, substantially square segments 4 each having a side of 0.5 mm are arranged in a matrix over the entire one surface 2a of the separator 2.

[Member Connection Method]

Next, a member connection method using the above-described adhesive tape 1 will be described.

The members 11A and 11B to be connected to which this member connection method is applied are not particularly limited, and the member connection method can be applied to members for arbitrary electronic components. Here, a connection between the members 11A and 11B to be connected having a large number of electrodes is exemplified. The member connection method includes a cutting step of forming the cutting lines C in the adhesive layer 3 of the adhesive tape 1, a transfer step of transferring the adhesive layer 3 to one member 11A to be connected, and a connection step of connecting members 11A and 11B to be connected via the transferred adhesive layer 3.

Figure 3:
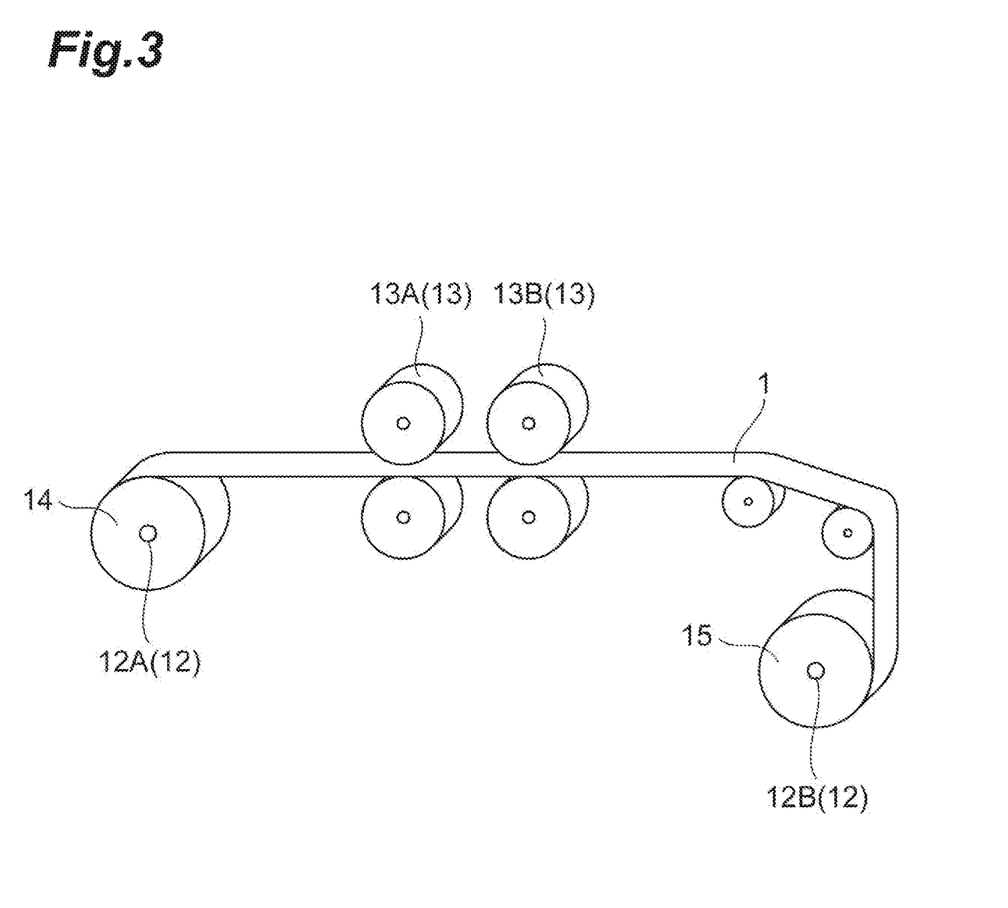
FIG. 3 is a schematic view showing an example of a cutting step.

In the cutting step, for example, as shown in FIG. 3, a conveying device 12 which conveys the adhesive tape 1 at a constant speed and a cutting device 13 which forms the cutting lines in the adhesive tape 1 conveyed by the conveying device 12 are used. The conveying device 12 includes a delivering roller 12A which delivers the adhesive tape 1 from a tape roll 14, and a winding roller 12B which winds the adhesive tape 1 delivered from the tape roll 14. Further, the cutting device 13 includes a first cutting device 13A which forms the cutting lines C in the adhesive layer 3 at predetermined intervals in the width direction of the adhesive tape 1, and a second cutting device 13B which forms the cutting lines C in the adhesive layer 3 at predetermined intervals in the lengthwise direction of the adhesive tape 1. Either of the first cutting device 13A and the second cutting device 13B may be disposed on the upstream side in a conveying direction.

The adhesive tape 1 delivered from the tape roll 14 of the delivering roller 12A passes through the first cutting device 13A and the second cutting device 13B in a process in which it is conveyed toward the winding roller 12B. Thus, the cutting lines C are formed in the adhesive layer 3 at predetermined intervals in the width direction and the lengthwise direction of the adhesive tape 1, and the segments 4 of the adhesive layer 3 divided by the cutting lines C are in the continuous state in the width direction and the lengthwise direction of the adhesive tape 1 (refer to FIG. 2). After the cutting lines C are formed, the adhesive tape 1 is wound by the winding roller 12B to form a wound body 15.

The adhesive tape 1 is stored in a state of the wound body 15 and is conveyed to a site in which the transfer step is performed.

Further, a slit processing device may be disposed on the rear end side of the first cutting device 13A and the second cutting device 13B, and a plurality of strips of the adhesive tape 1 finely processed by the slit processing device may be respectively wound by a plurality of winding rollers 12B.

Figure 4:
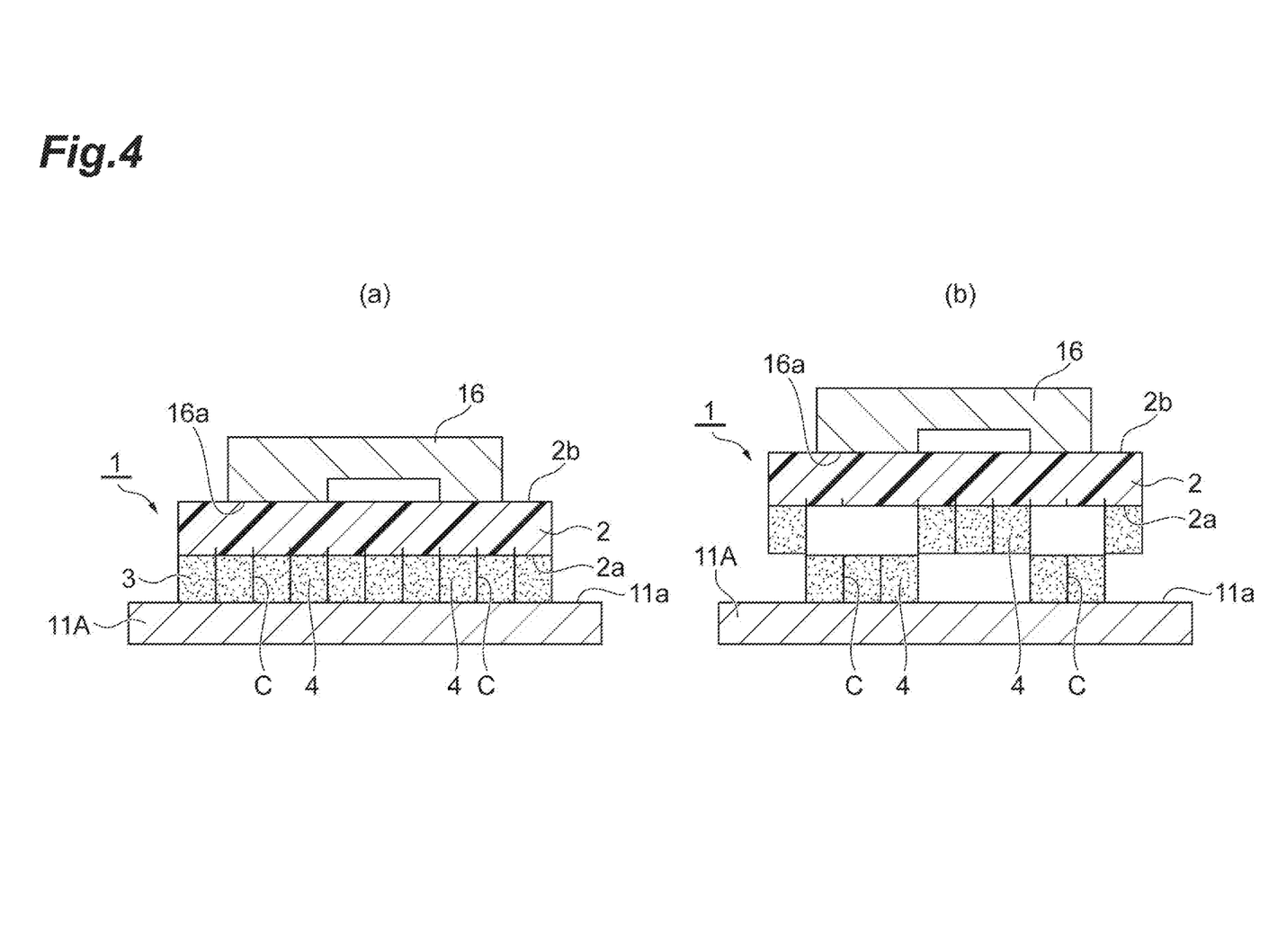
FIG. 4 is a schematic cross-sectional view showing an example of a transfer step.

In the transfer step, for example, as shown in FIG. 4, the adhesive tape 1 is disposed on the one member 11A to be connected so that the segments 4 of the adhesive layer 3 face a connection surface 11a of the one member 11A to be connected. The adhesive tape 1 may be pulled out from the wound body 15 and used, or a portion pulled out from the wound body 15 may be cut and used. Further, in the transfer step, a heating and pressing tool 16 is used. The heating and pressing tool 16 is formed of, for example, stainless steel, ceramic, or the like and has an arbitrary pattern shape on the heating and pressing surface 16a side.

In the transfer step, as shown in FIG. 4(a), the heating and pressing surface 16a of the heating and pressing tool 16 is pressed against the adhesive tape 1 from the separator 2 side to bring the adhesive layer 3 into close contact with the connection surface 11a of the one member 11A to be connected. Thus, as shown in FIG. 4(b), only the segments 4 of the adhesive layer 3 corresponding to a pressing portion of the heating and pressing tool 16 are selectively transferred onto the connection surface 11a of the one member 11A to be connected. A pressure applied by the heating and pressing tool 16 is, for example, about 0.5 MPa to 5 MPa, and a temperature applied by the heating and pressing tool 16 is about 25° C. to 90° C.

Figure 5:
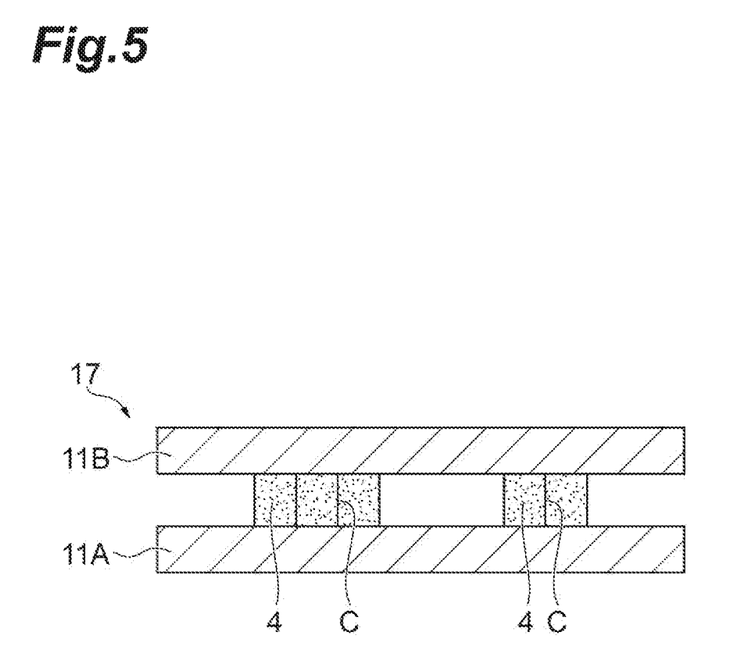
FIG. 5 is a schematic cross-sectional view showing an example of a connection step.

In the connection step, for example, as shown in FIG. 5, the one member 11A to be connected to which the segments 4 of the adhesive layer 3 are selectively transferred is connected to another member 11B to be connected. Thus, a connection structure 17 in which the one member 11A to be connected is connected to another member 11B to be connected via the segments 4 of the adhesive layer 3 is obtained.

Operation and Effects

As described above, in the member connection method, the segments 4 of the adhesive layer 3 are made continuous in advance in the lengthwise direction of the adhesive tape 1 by the cutting lines C formed in the adhesive layer 3 in the cutting step. Then, in the transfer step, the segments 4 of the adhesive layer 3 are selectively transferred to the one member 11A to be connected using the heating and pressing tool 16. A pattern shape of the segments 4 of the adhesive layer 3 transferred in the transfer step can be arbitrarily adjusted by a pattern shape of the heating and pressing tool 16. Therefore, the adhesive layer 3 can be disposed in an arbitrary shape with respect to the one member 11A to be connected. Further, in the member connection method, since the segments 4 of the adhesive layer 3 are made continuous in advance in the lengthwise direction of the adhesive tape 1, as compared to a method in which the half-cutting of the adhesive layer is performed in the attaching step (refer to FIGS. 6 and 7), strict alignment between the one member 11A to be connected and the adhesive layer 3 is not required in the transfer step.

Further, in the embodiment, in the cutting step, the cutting lines C are formed in the adhesive layer 3 at predetermined intervals in the width direction and the lengthwise direction of the adhesive tape 1, and the segments 4 of the adhesive layer 3 divided by the cutting lines C are made continuous in the width direction and the lengthwise direction of the adhesive tape 1. Thus, since the segments 4 of the adhesive layer 3 are two-dimensionally formed, a degree of freedom in arrangement of the adhesive layer 3 with respect to the one member 11A to be connected can be improved.

Further, in the embodiment, in the cutting step, the adhesive tape 1 is delivered from the tape roll 14, the cutting lines C are formed in the adhesive layer 3, and then the adhesive tape 1 is wound to form a wound body 15. In this case, since the cutting step and the transfer step are separated from each other, it is possible to avoid an increase in size and complexity of the device on the site in which the transfer step is performed.

Further, in the embodiment, the adhesive layer 3 is provided on the entire surface of the separator 2 on the one surface 2a side. Thus, it is possible to further reduce the requirement for alignment accuracy between the one member 11A to be connected and the adhesive layer 3 in the transfer step.

Modified Example

The present invention is not limited to the above-described embodiment. For example, in the above-described embodiment, although the cutting lines C are formed in the adhesive layer 3 at predetermined intervals in the width direction and the lengthwise direction of the adhesive tape 1, the cutting lines C may be formed only in the width direction of the adhesive tape 1. Also, in the above-described embodiment, although the linear cutting lines C have been exemplified, the cutting lines C is not limited to the linear shape and may be formed in other shapes such as a curved shape, a meandering line shape, and a zigzag shape. The interval between the cutting lines C is not limited to a fixed value and may change with a periodicity, for example. The intervals between the cutting lines C may be different from each other in the width direction and the lengthwise direction of the adhesive tape 1. Further, for example, in the above-described embodiment, the shape of the segment 4 of the adhesive layer 3 is a square shape, but other shapes such as a rectangle, a rhombus, a triangle, a polygon, a circle, and an ellipse may be used.

REFERENCE SIGNS LIST

1 . . . Adhesive tape, 2 . . . Separator, 2a . . . One surface, 3 . . . Adhesive layer, 4 . . . Segment, 11A, 11B . . . Member to be connected, 11a . . . Connection surface, 14 . . . Tape roll, 15 . . . Wound body, 16 . . . heating and pressing tool, C . . . Cutting line

The invention claimed is:

1. A member connection method for connecting members to be connected using an adhesive tape having an adhesive layer provided on one surface side of a separator, comprising:
    a cutting step of forming cutting lines in the adhesive layer at a predetermined interval at least in a width direction of the adhesive tape and making segments of the adhesive layer divided by the cutting lines continuous in a width direction and a lengthwise direction of the adhesive tape;
    a transfer step of disposing the segments of the adhesive layer to face a connection surface of one member to be connected, pressing a heating and pressing tool having an arbitrary pattern shape against the adhesive tape from a separator side and selectively transferring the segments of the adhesive layer corresponding to a pressing portion of the heating and pressing tool to the one member to be connected; and
    a connection step of connecting another member to be connected to the one member to be connected via the segments of the adhesive layer transferred to the one member to be connected.

2. The member connection method according to claim 1, wherein, in the cutting step, the cutting lines are formed in the adhesive layer at predetermined intervals in the width direction and the lengthwise direction of the adhesive tape.

3. The member connection method according to claim 1, wherein, in the cutting step, after the adhesive tape is delivered from a tape roll and the cutting lines are formed in the adhesive layer, the adhesive tape is wound to form a wound body.

4. The member connection method according to claim 1, wherein the adhesive layer is provided on an entire surface of the separator on one surface side.

5. The member connection method according to claim 1, wherein the cutting lines are formed to reach the one surface side of the separator from an adhesive layer side of the adhesive tape.

6. An adhesive tape having an adhesive layer provided on one surface side of a separator,
    wherein cutting lines are formed in the adhesive layer at a predetermined interval at least in a width direction of the adhesive tape, and segments of the adhesive layer divided by the cutting lines are continuous in a width direction and a lengthwise direction of the adhesive tape.

7. The adhesive tape according to claim 6, wherein the cutting lines are formed to reach the one surface side of the separator from an adhesive layer side of the adhesive tape.

* * * * *